US008658001B2

(12) United States Patent
Ockenfuss et al.

(10) Patent No.: US 8,658,001 B2
(45) Date of Patent: Feb. 25, 2014

(54) METHOD AND CONTROL SYSTEM FOR DEPOSITING A LAYER

(75) Inventors: Georg J. Ockenfuss, Santa Rosa, CA (US); Markus K. Tilsch, Santa Rosa, CA (US)

(73) Assignee: JDS Uniphase Corporation, Milpitas, CA (US)

( * ) Notice: Subject to any disclaimer, the term of this patent is extended or adjusted under 35 U.S.C. 154(b) by 1496 days.

(21) Appl. No.: 12/045,473

(22) Filed: Mar. 10, 2008

(65) Prior Publication Data

US 2008/0223716 A1 Sep. 18, 2008

Related U.S. Application Data

(60) Provisional application No. 60/894,511, filed on Mar. 13, 2007.

(51) Int. Cl.
*C23C 14/34* (2006.01)

(52) U.S. Cl.
USPC .................................. 204/192.12; 204/192.13

(58) Field of Classification Search
USPC ............. 204/192.12, 298.01, 298.02, 298.03, 204/192.13
See application file for complete search history.

(56) References Cited

U.S. PATENT DOCUMENTS

| | | | |
|---|---|---|---|
| 4,166,783 A | 9/1979 | Turner | 204/192.13 |
| 4,500,408 A | 2/1985 | Boys et al. | 204/298.03 |
| 4,957,605 A | 9/1990 | Hurwitt et al. | 204/192.12 |
| 5,174,875 A | 12/1992 | Hurwitt et al. | 204/192.12 |
| 5,754,297 A | 5/1998 | Nulman | 356/630 |
| 5,911,856 A | 6/1999 | Suzuki et al. | 204/192.13 |
| 5,955,139 A | 9/1999 | Iturralde | 427/9 |
| 6,440,280 B1 | 8/2002 | Burton et al. | 204/298.06 |
| 6,475,354 B1 | 11/2002 | Toyama | 204/192.13 |
| 6,554,968 B1 | 4/2003 | Kearney et al. | 204/192.11 |
| 6,746,577 B1 | 6/2004 | Barber et al. | 204/192.13 |
| 7,324,865 B1 | 1/2008 | Sonderman et al. | 700/121 |
| 2006/0144335 A1 | 7/2006 | Lee et al. | 118/719 |
| 2007/0227877 A1* | 10/2007 | Wang | 204/192.1 |

FOREIGN PATENT DOCUMENTS

WO    WO 2006/032925    3/2006    ............ H01J 37/32

* cited by examiner

*Primary Examiner* — Keith Hendricks
*Assistant Examiner* — John Brayton
(74) *Attorney, Agent, or Firm* — Matthew A. Pequignot; Pequignot + Myers LLC

(57) ABSTRACT

A method and control system are provided for depositing a layer in a sputter-deposition system having a target cathode. A first dependence relationship of a deposition rate of the layer on an operating parameter, selected from cathode voltage, cathode current, and cathode power, is provided prior to deposition of the layer. A second dependence relationship of the operating parameter on time is measured during deposition of the layer, while a different operating parameter, also selected from cathode voltage, cathode current, and cathode power, is held substantially constant. On the basis of the first and second dependence relationships, a deposition time for the layer is dynamically determined during deposition of the layer.

12 Claims, 4 Drawing Sheets

METHOD AND CONTROL SYSTEM FOR DEPOSITING A LAYER

CROSS-REFERENCE TO RELATED APPLICATIONS

The present invention claims priority from U.S. Provisional Patent Application No. 60/894,511 filed Mar. 13, 2007, entitled "Control Of Thickness And Refractive Index In Thin Film Coatings" by Ockenfuss et al., which is incorporated herein by reference.

TECHNICAL FIELD

The present invention relates to thin-film deposition and, in particular, to sputter deposition of a layer to a reference deposition thickness.

BACKGROUND OF THE INVENTION

Sputter deposition is widely used for depositing thin films and enables the fabrication of a broad range of devices and components. Sputter deposition is particularly useful for the fabrication of thin-film devices for optical applications. Such thin-film devices can include a single layer or a plurality of layers ranging in number from two to several thousand. The spectral performance of such thin-film devices depends on the thicknesses of the layers they include. Thus, the capability to deposit layers to a reference deposition thickness is of critical importance.

A typical sputter-deposition system includes a target cathode, an anode, a substrate, a plasma, and a power supply. The target cathode, anode, and substrate are disposed within a vacuum chamber, into which a gas is introduced. The power supply, which is located outside the vacuum chamber, is used to apply a voltage between the target cathode and the anode, hereafter referred to as cathode voltage. The cathode voltage partially ionizes the gas in the vacuum chamber, creating a plasma. The plasma contains positively charged ions, which are attracted to the negatively charged target cathode and accelerate towards it. When the ions collide with the target cathode, target material is sputtered from the target cathode. The sputtered target material deposits as a layer on the substrate, as well as on other surfaces of the sputter-deposition system. Typical target materials include: metallic elements, such as tantalum, niobium, and aluminum; semiconducting elements, such as silicon and germanium; and conductive oxides, such as $(In_2O_3)_{1-x}(SnO_2)_x$ (indium tin oxide (ITO)), $Ta_2O_{5-x}$, and $TiO_{2-x}$, among others.

Many variants of sputter deposition have been developed. In magnetron sputter deposition, a magnetron is included in the sputter-deposition system to produce magnetic fields in the vicinity of the target cathode. The magnetic fields confine electrons and create a denser plasma to increase the sputtering rate. In reactive sputter deposition, a gas mixture of an inert gas and a reactive gas is introduced into the vacuum chamber of the sputter-deposition system, and the layer is formed by chemical reaction between the target material and the reactive gas. In pulsed direct-current (DC) sputter deposition, the voltage between the target cathode and the anode is periodically reversed to a small opposite voltage to minimize charge build-up and arcing. In alternating-current (AC) sputter deposition, an AC voltage is applied between two target electrodes, which alternate being the cathode and the anode to minimize arcing. In radio-frequency (RF) sputter deposition, an RF voltage is applied between a target electrode and a second electrode to minimize charge build-up, allowing nonconductive materials to be sputtered. In high-power pulsed magnetron sputter deposition, short high-power pulses are supplied to the target cathode in a magnetron sputter-deposition system to produce a plasma so dense that a large proportion of the sputtered target material is ionized, leading to deposition of dense and well-adhering layers.

In any sputter-deposition technique, the sputtering rate of target material from the target cathode and the related deposition rate of the layer on the substrate are influenced by a large number of operating parameters, among them the power supplied to create and maintain the plasma, hereafter referred to as cathode power, the current drawn by the target cathode, hereafter referred to as cathode current, the impedance of the plasma between the target cathode and the anode, hereafter referred to as cathode impedance, and cathode voltage.

When the deposition rate of a layer is known, a deposition time at which the layer has a reference deposition thickness may be determined. The dependence relationship d(T) of the deposition thickness of the layer on time is equal to an integral over time of the dependence relationship r(t) of the deposition rate on time, according to:

$$d(T) = \int_0^T r(t)dt. \quad (1)$$

Typically, the power supply of the sputter-deposition system is configured to provide constant cathode power, and the deposition rate is assumed to be a constant reference deposition rate $r_r$, such that:

$$d(T) = r_r T. \quad (2)$$

In some instances, a constant offset term b may be included in Equation (2) to correct for any transient variation in the deposition rate over time, arising from starting or stopping deposition of the layer, or from delays between computer commands and device responses, for example, giving:

$$d(T) = r_r T + b. \quad (3)$$

For simplicity, such a constant offset term will not be explicitly considered in the following.

Conventionally, a reference deposition time $t_r$ at which the layer has a reference deposition thickness $d_r$ is determined on the basis of the reference deposition rate $r_r$, according to:

$$t_r = \frac{d_r}{r_r}. \quad (4)$$

However, this approach relies on the assumption that the deposition rate is constant when cathode power is held constant at a reference value, which is often incorrect.

For instance, during deposition of a layer at constant cathode power, the accumulation of sputtered target material on surfaces of the sputter-deposition system may lead to changes in cathode impedance. To maintain constant cathode power, the power supply automatically adjusts cathode voltage and cathode current to compensate for the changes in cathode impedance. The variation in cathode voltage and cathode current over time may result in departures of the deposition rate from the reference deposition rate over time and, thus, in errors in the deposition thickness of the layer.

To maintain a constant reference deposition rate of a layer, one or more operating parameters of the sputter-deposition system can be adjusted during deposition of the layer. For example, the deposition rate can be regulated by adjusting cathode power, as described in U.S. Pat. No. 4,166,783 to Turner, U.S. Pat. No. 5,174,875 to Hurwitt, et al., and U.S. Pat. No. 5,911,856 to Suzuki, et al., by adjusting a magnetic field during magnetron sputter deposition, as described in U.S. Pat. No. 4,500,408 to Boys, et al., by adjusting a flow rate of a reactive gas during reactive sputter deposition, as described in U.S. Pat. No. 5,911,856 to Suzuki, et al., U.S. Pat. No. 6,475,354 to Toyama, and World Patent Application No. WO 2006/032925 to Gibson, et al., or by adjusting plasma density, as described in U.S. Pat. No. 6,554,968 to Kearney, et al.

In particular, a method of regulating the deposition rate of a layer by adjusting the composition of a gas mixture during reactive sputter deposition is disclosed in U.S. Pat. No. 6,746,577 to Barber, et al. During deposition of the layer, cathode current or cathode voltage is held constant at a reference value, and the composition of the gas mixture is regulated to maintain cathode impedance at a reference value. Hence, a nearly constant reference deposition rate is maintained. To compensate for any momentary variation in the deposition rate over time, the energy delivered to the target cathode, hereafter referred to as cathode energy, is summed over time during deposition of the layer. Deposition of the layer is automatically stopped once a reference cathode energy has been supplied.

As an extension of the strategy of maintaining a constant reference deposition rate of a layer, the growth of the layer or the erosion of the target cathode may be directly monitored during deposition of the layer to ascertain the deposition rate of the layer. If departures of the deposition rate from the reference deposition rate are detected, operating parameters may be adjusted accordingly, as described in U.S. Pat. No. 5,754,297 to Nulman, U.S. Pat. No. 5,955,139 to Iturralde, and U.S. Pat. No. 7,324,865 to Sonderman, et al., for example. Similarly, a deposition rate of a layer ascertained by directly monitoring the growth of the layer or the erosion of the target cathode may be used to determine a deposition time at which the layer has a reference deposition thickness, as described in U. S. Patent Application No. 2006/0144335 to Lee, et al., for example.

Variants of such strategies have also been developed for improving the uniformity of the deposition thickness of a layer on particular substrates, such as stepped wafers, as disclosed in U.S. Pat. No. 4,957,605 to Hurwitt, et al., or lens elements, as disclosed in U.S. Pat. No. 6,440,280 to Burton, et al.

An object of the present invention is to overcome the shortcomings of the prior art by providing a simple method and control system for depositing a layer in a sputter-deposition system having a target cathode. Prior to deposition of the layer, a first dependence relationship of a deposition rate of the layer on an operating parameter selected from cathode voltage, cathode current, and cathode power is provided. During deposition of the layer, instead of stabilizing the deposition rate by adjusting the operating parameter, the operating parameter is allowed to drift over time. A second dependence relationship of the operating parameter on time is measured, while a different operating parameter, also selected from cathode voltage, cathode current, and cathode power, is held substantially constant. On the basis of the first and second dependence relationships, a deposition time for the layer is dynamically determined during deposition of the layer, without directly monitoring the growth of the layer or the erosion of the target cathode.

SUMMARY OF THE INVENTION

Accordingly, the present invention relates to a method for depositing a layer in a sputter-deposition system having a target cathode, comprising ordered steps of: a) selecting first and second parameters from a group of operating parameters consisting of cathode voltage, cathode current, and cathode power, such that the first and second parameters are different operating parameters; b) providing a first dependence relationship of a deposition rate of the layer on the first parameter; c) starting deposition of the layer; d) holding the second parameter substantially constant at a reference value during deposition of the layer; e) measuring a second dependence relationship of the first parameter on time during deposition of the layer; f) determining a deposition time for the layer on the basis of the first and second dependence relationships during deposition of the layer; and g) stopping deposition of the layer at the deposition time.

Another aspect of the present invention relates to a control system for depositing a layer in a sputter-deposition system having a target cathode, comprising: an interface for selecting first and second parameters from a group of operating parameters consisting of cathode voltage, cathode current, and cathode power, such that the first and second parameters are different operating parameters, and for providing a first dependence relationship of a deposition rate of the layer on the first parameter; and a controller configured to control a power supply to start deposition of the layer, to control the power supply to hold the second parameter substantially constant at a reference value during deposition of the layer, to monitor the power supply to measure a second dependence relationship of the first parameter on time during deposition of the layer, to determine a deposition time for the layer on the basis of the first and second dependence relationships during deposition of the layer, and to control the power supply to stop deposition of the layer at the deposition time.

Another aspect of the present invention relates to a control system for depositing a layer in a sputter-deposition system having a target cathode, comprising: a) means for selecting first and second parameters from a group of operating parameters consisting of cathode voltage, cathode current, and cathode power, such that the first and second parameters are different operating parameters; b) means for providing a first dependence relationship of a deposition rate of the layer on the first parameter; c) means for starting deposition of the layer; d) means for holding the second parameter substantially constant at a reference value during deposition of the layer; e) means for measuring a second dependence relationship of the first parameter on time during deposition of the layer; f) means for determining a deposition time for the layer on the basis of the first and second dependence relationships during deposition of the layer; and g) means for stopping deposition of the layer at the deposition time.

BRIEF DESCRIPTION OF THE DRAWINGS

The invention will be described in greater detail with reference to the accompanying drawings, which represent preferred, exemplary embodiments thereof, wherein.

DETAILED DESCRIPTION

Figure 1:
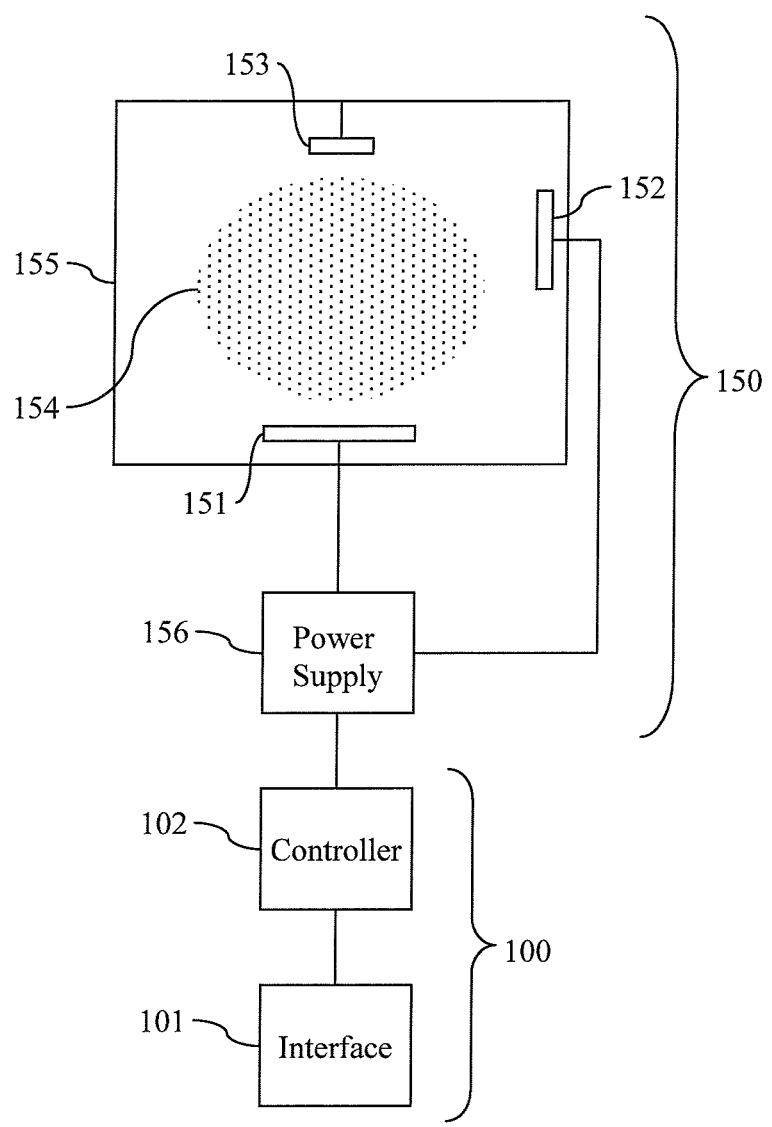
FIG. 1 is a schematic illustration of a control system for depositing a layer in a sputter-deposition system having a target cathode.

With reference to FIG. 1, the present invention provides method and a control system 100 for depositing a layer in a sputter-deposition system 150 having a target cathode 151. The control system 100 includes an interface 101 and a controller 102. In addition to the target cathode 151, the sputter-deposition system 150 includes an anode 152, a substrate 153, and a plasma 154 inside a vacuum chamber 155, as well as a power supply 156 outside the vacuum chamber 155. In other embodiments, the sputter-deposition system 150 may have an alternative arrangement of the specified components or may include additional components, as suitable for any of the variants of sputter deposition mentioned heretofore, among others.

The power supply 156 is connected to the target cathode 151 and the anode 152, and can be controlled to hold one operating parameter, selected from a group of operating parameters consisting of cathode power, cathode voltage, and cathode current, substantially constant at a reference value. Preferably, the power supply 156 can be controlled to hold any operating parameter of the group of operating parameters substantially constant. In some instances, the power supply 156 can ramp to the reference value of the operating parameter.

The power supply 156 is also connected to the controller 102 of the control system 100, which is preferably a programmable logic controller (PLC). The controller 102 is configured to control and monitor the power supply 156. The controller 102 communicates the reference value of the operating parameter to be held substantially constant to the power supply 156 and turns the power supply 156 on and off. Preferably, the controller 102 also communicates which operating parameter is to be held substantially constant, as well as any ramp parameters, to the power supply 156. In addition, the controller 102 measures at least one dependence relationship of at least one other operating parameter, also selected from the group of operating parameters, on time by monitoring the power supply. The controller 102 is also provided with a program for determining a deposition time for the layer.

The controller 102 is connected to the interface 101, which is configured to communicate information to the controller 102. Preferably, the interface 101 is a human-machine interface (HMI), such as a personal computer, provided with a program for controlling and monitoring the controller 102 and, hence, the power supply 156. For example, the program of the interface 101 allows the user to modify the program of the controller 102 by selecting parameters and by providing data. The program of the interface 101 can perform calculations on input data or on data received from the power supply 156 via the controller 102. Preferably, the program of the interface 101 also allows a user to direct the controller 102 to turn the power supply 156 on and off.

In other embodiments, the control system 100 may have an alternative architecture. In some instances, the controller 102 may be integrated with the interface 101, as a controller program loaded on a personal computer, for example. Any number of interfaces 101, controllers 102, and measurement devices may be combined to perform the functions of selecting parameters, providing data, controlling and monitoring the power supply 156, and determining a deposition time for the layer.

Figure 2:
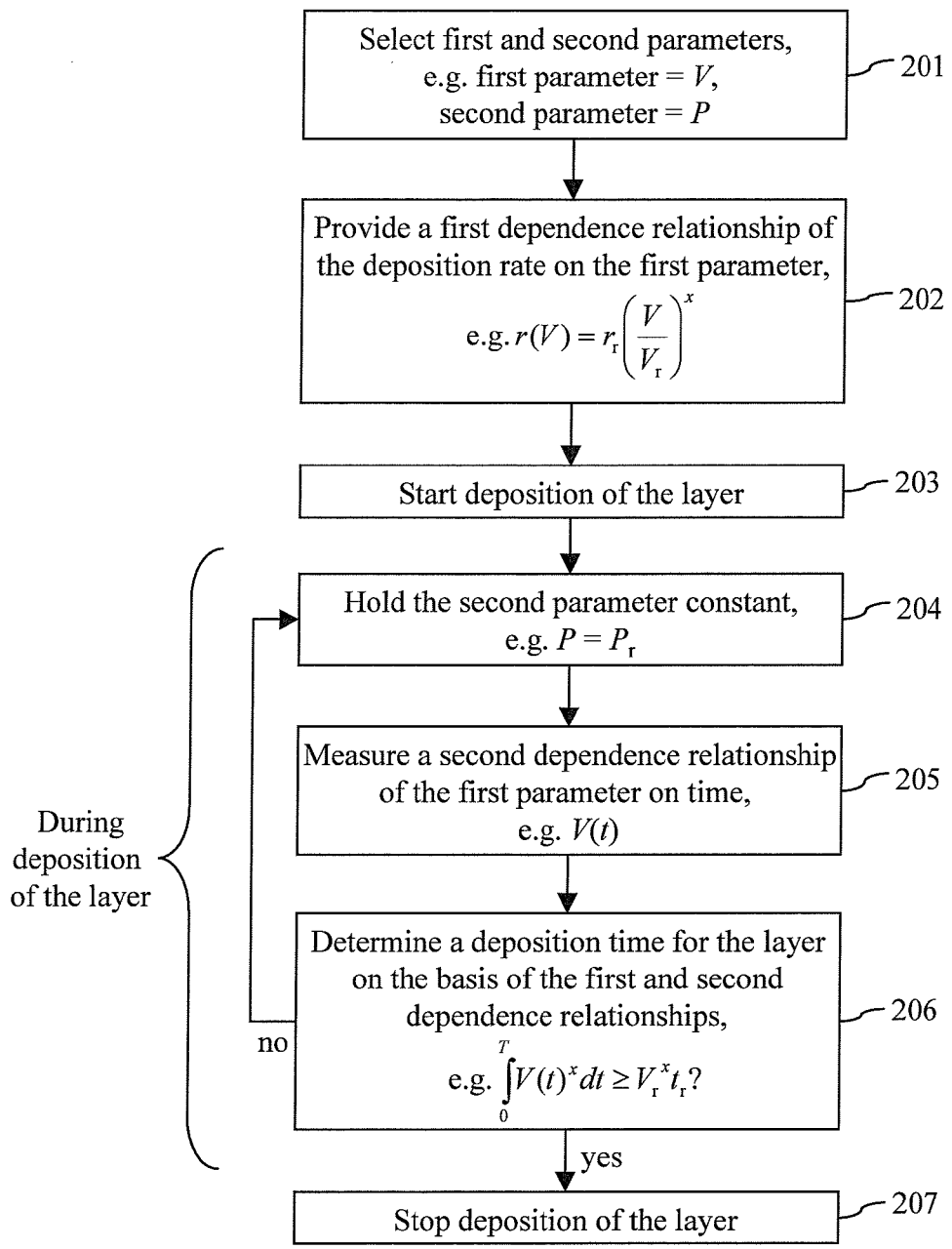
FIG. 2 is a flowchart of a first embodiment of a method for depositing a layer in a sputter-deposition system having a target cathode.

With reference to FIG. 2, a first embodiment of a method for depositing a layer in a sputter-deposition system 150 having a target cathode 151, as provided by the present invention, is described in detail in the following. Although the first embodiment is described in the context of depositing a single layer, it can also be applied to depositing multiple layers. In a first step 201, first and second parameters are selected from a group of operating parameters consisting of cathode voltage, cathode current, and cathode power, such that the first and second parameters are different operating parameters. In accordance with this selection, the first parameter will be allowed to drift over time during deposition of the layer, and the second parameter will be held substantially constant at a reference value. The selection of the first and second parameters is, preferably, carried out using the interface 101 by inputting the first and second parameters to the program of the interface 101 or by choosing the first and second parameters from a menu of the program.

In a second step 202, a first dependence relationship of a deposition rate of the layer on the first parameter is provided. For example, when cathode voltage V is selected as the first parameter, the first dependence relationship r(V) of the deposition rate on cathode voltage is, preferably, expressed as a power function including a reference constant k and a non-zero dependence exponent x, i.e. x≠0, according to:

$$r(V) = kV^x. \quad (5)$$

The dependence exponent is, preferably, greater than or equal to −3 and smaller than or equal to 3, i.e. −3≤x≤3.

As the first dependence relationship of the deposition rate on the first parameter depends on the target material and the operating conditions during deposition of the layer, the reference constant and the dependence exponent are, preferably, determined from one or more previous depositions of layers using the same target material under similar operating conditions. In some instances, the first dependence relationship is provided by inputting predetermined values of the reference constant and the dependence exponent to the program of the interface 101. In other instances, the reference constant and the dependence exponent are calculated by the program of the interface 101.

Preferably, the reference constant included in the first dependence relationship includes a reference deposition rate and a corresponding reference value of the first parameter. For example, when the first parameter is cathode voltage, the reference constant k is expressed as:

$$k = \frac{r_r}{V_r^x}, \quad (6)$$

where $r_r$ is the reference deposition rate and $V_r$ is a reference value of cathode voltage. By substituting Equation (6) into Equation (5), the first dependence relationship r(V) of the deposition rate on cathode voltage becomes:

$$r(V) = r_r \left(\frac{V}{V_r}\right)^x, \quad (7)$$

which, if desired, may be linearized, according to:

$$r(V) = r_r + \frac{xr_r}{V_r}(V - V_r). \quad (8)$$

Thus, in some instances, the first dependence relationship is provided by inputting predetermined values of the reference deposition rate, the reference value of the first parameter, and the dependence exponent to the program of the interface 101. In other instances, the reference deposition rate, the reference value of the first parameter, and the dependence exponent are calculated by the program of the interface 101, on the basis of input data or data received from the power supply 156 via the controller 102.

Preferably, the reference deposition rate and the reference value of the first parameter are determined from one or more previous depositions of layers. For instance, one or more depositions of layers of a material may be carried out while measuring a second dependence relationship of the first parameter on time and while holding the second parameter substantially constant at a reference value. When one such deposition of a layer is carried out, the average deposition rate $r_a$ of the layer, calculated from the measured deposition thickness $d_m$ and the measured deposition time $t_m$, using a rearrangement of Equation (4), according to:

$$r_r = r_a = \frac{d_m}{t_m}, \tag{9}$$

is used as the reference deposition rate $r_r$ for a future deposition of a layer of that material at that reference value of the second parameter. Preferably, the average deposition rate of the layer is used as the reference deposition rate for the next deposition of a layer.

When multiple such depositions of layers are carried out, using the same target material under similar operating conditions, the average deposition rate is calculated for each layer, according to Equation (9). An average of the average deposition rates of the layers may be calculated and used as the reference deposition rate. In such a calculation, the average deposition rates of the layers may be weighted by importance. Alternatively, a regression analysis over time of the average deposition rates of the layers may be used to determine the reference deposition rate for the next deposition of a layer.

When the one or more deposited layers are included in a thin-film device for an optical application, the measured deposition thicknesses of the one or more layers may be determined by measuring the spectral performance of the thin-film device. Theoretical spectral performances, calculated for different deposition thicknesses, are then matched to the measured spectral performance of the thin-film device. In some instances, the determination of the measured deposition thicknesses of multiple layers may be constrained, such that the layers have a common average deposition rate.

Likewise, the reference value of the first parameter is determined from one or more previous depositions of layers. For instance, one or more depositions of layers of a material may be carried out while measuring a second dependence relationship of the first parameter on time and while holding the second parameter substantially constant at a reference value. When one such deposition of a layer is carried out, the average value of the first parameter is used as the reference value of the first parameter. For example, when the first parameter is cathode voltage, the average value of cathode voltage $V_a$ is used as the reference value of cathode voltage $V_r$ for a future deposition of a layer of that material at that reference value of the second parameter, that is:

$$V_r = V_a. \tag{10}$$

Preferably, the average value of cathode voltage is used as the reference value of cathode voltage for the next deposition of a layer.

When multiple such depositions of layers are carried out, using the same target material under similar operating conditions, the average value of cathode voltage is measured for each deposition of a layer. An average of the average values of cathode voltage may be calculated and used as the reference value of cathode voltage. In such a calculation, the average values of cathode voltage may be weighted by importance. Alternatively, a regression analysis over time of the average values of cathode voltage may be used to determine the reference value of cathode voltage for the next deposition of a layer. For reactive sputter deposition of a layer of $SiO_2$, typical reference values of cathode voltage, cathode current, and cathode power are 450 V, 11 A, and 5 kW, respectively.

Preferably, the dependence exponent is also determined from one or more previous depositions of layers. For instance, one or more depositions of layers of a material may be carried out while measuring a second dependence relationship of the first parameter on time and while holding the second parameter substantially constant at a reference value. The measured deposition thickness of each layer is compared to predicted deposition thicknesses calculated for different dependence exponents. For example, when the first parameter is cathode voltage, predicted deposition thicknesses $d_p$ for each layer are calculated from the average value of cathode voltage $V_a$, the measured deposition time $t_m$, the reference deposition rate $r_r$, and the reference value of cathode voltage $V_r$ for different dependence exponents x, according to:

$$d_p = r_r \left(\frac{V_a}{V_r}\right)^x t_m. \tag{11}$$

The dependence exponent that gives the best agreement between the predicted deposition thicknesses and the measured deposition thicknesses of the layers is selected. For reactive sputter deposition of a layer of $SiO_2$, when the first parameter is cathode voltage and the second parameter is cathode power, the dependence exponent is substantially equal to 1, i.e. the first dependence relationship of the deposition rate on cathode voltage is linear.

As mentioned heretofore, when the one or more deposited layers are included in a thin-film device for an optical application, the measured deposition thicknesses of the one or more layers may be determined by measuring the spectral performance of the thin-film device and by matching theoretical spectral performances, calculated for different deposition thicknesses, to the measured spectral performance.

In some instances, as a result of drift in operating conditions of the sputter deposition system, the reference values of the first and second parameters may have to be adjusted after a period of time to maintain the deposition rate of the layer near the reference deposition rate. Preferably, the reference values of the first and second parameters of one or more previous depositions of layers are updated on the basis of a difference between the reference deposition rate and a deposition rate of the layers in the one or more previous depositions.

For example, when the first parameter is cathode voltage and the second parameter is cathode power, the rate difference $\Delta r$ between the reference deposition rate $r_r$ and the average deposition rate $r_a$ of the layer, calculated as described heretofore, is:

$$\Delta r = r_r - r_a. \tag{12}$$

To achieve an average deposition rate equal to the reference deposition rate, the reference value of cathode power must be adjusted by a power correction term $\Delta P$, which is calculated from the rate difference $\Delta r$, according to:

$$\Delta P = \frac{\Delta r}{k_P}, \tag{13}$$

where $k_P$ is an empirically determined power reference constant. Preferably, the power reference constant is determined by performing multiple depositions of layers at different reference values of cathode power and measuring the average deposition rates. The power reference constant is the slope of a linear fit to these data. Application of the power correction term to the reference value of cathode power $P_{r1}$ gives an updated reference value of cathode power $P_{r2}$, according to:

$$P_{r2} = P_{r1} + \Delta P. \quad (14)$$

A corresponding voltage correction term $\Delta V$ is calculated from the power correction term $\Delta P$, according to:

$$\Delta V = k_V \Delta P, \quad (15)$$

where $k_V$ is an empirically determined voltage reference constant. Preferably, the voltage reference constant is determined by performing multiple depositions at different reference values of cathode power and measuring the average values of cathode voltage. The voltage reference constant is the slope of a linear fit to these data. Application of the voltage correction term to the average value of cathode voltage $V_a$ measured during deposition of the layer gives the updated reference value of cathode voltage $V_r$, according to:

$$V_r = V_a + \Delta V. \quad (16)$$

Updating of the reference deposition rate and the reference values of the first and second parameters is, preferably, performed by the program of the interface 101, on the basis of input data or data received from the power supply 156 via the controller 102. Preferably, the reference deposition rate and the reference values of the first and second parameters are updated regularly. The reference deposition rate and the reference values of the first and second parameters can be updated whenever the average deposition rate of a layer is determined from the measured deposition thickness of the layer and the measured deposition time, as described heretofore. Most preferably, the average deposition rate of every layer is determined, and the reference deposition rate and the reference values of the first and second parameters are updated after every deposition of a layer.

Once the first and second parameters have been selected and the first dependence relationship of the deposition rate on the first parameter has been provided, the program of the interface 101 communicates this information to the controller 102. In a third step 203, deposition of the layer is started. Preferably, the user starts deposition of the layer via the interface 101, which delivers the command to the controller 102. The controller 102 then controls the power supply 156 to start deposition of the layer. The power supply may be simply turned on at the reference value of the second parameter or may be programmed to ramp the reference value of the second parameter. In some instances, the power supply may be turned on at the reference value of the second parameter, while the substrate is shielded by a shutter, which is then opened to begin deposition of the layer. As mentioned heretofore, short delays in reaching the reference value of the second parameter may be taken into account by including a constant offset term in relevant equations.

During deposition of the layer, the controller 102 controls the power supply 156 to hold the second parameter substantially constant at a reference value, in a fourth step 204, and monitors the power supply 156 to measure the second dependence relationship of the first parameter on time, in a fifth step 205. On the basis of the first dependence relationship of the deposition rate on the first parameter and the second dependence relationship of the first parameter on time, a deposition time for the layer is determined by the program of the controller 102, in a sixth step 206.

As the first parameter is allowed to drift over time during deposition of the layer, the deposition rate of the layer also drifts over time. The dependence relationship of the deposition rate on time includes the second dependence relationship of the first parameter on time. For example, when the first parameter is cathode voltage, the dependence relationship r(t) of the deposition rate on time is derived by including the second dependence relationship V(t) of cathode voltage on time in Equation (7), according to:

$$r(t) = r_r \left(\frac{V(t)}{V_r}\right)^x. \quad (17)$$

Considering Equation (1), the dependence relationship d(T) of the deposition thickness on time is:

$$d(T) = \frac{r_r}{V_r^x} \int_0^T V(t)^x dt. \quad (18)$$

To deposit a layer to a reference deposition thickness $d_r$, deposition of the layer must be stopped at a deposition time $t_d$, according to:

$$d_r = \frac{r_r}{V_r^x} \int_0^{t_d} V(t)^x dt. \quad (19)$$

Preferably, a condition for stopping deposition of the layer that includes a reference deposition time $t_r$ is derived by substituting Equation (4) into Equation (19) and rearranging to give:

$$\int_0^{t_d} V(t)^x dt = V_r^x t_r. \quad (20)$$

In some instances, the reference deposition time is calculated from the reference deposition rate and the reference deposition thickness, according to Equation (4). In such instances, the reference deposition thickness is, preferably, provided by inputting a predetermined value to the program of the interface 101, which then calculates the reference deposition time. In other instances, a reference deposition time corresponding to the reference value of the first parameter is provided, preferably, by inputting a predetermined value to the program of the interface 101.

Figure 3:
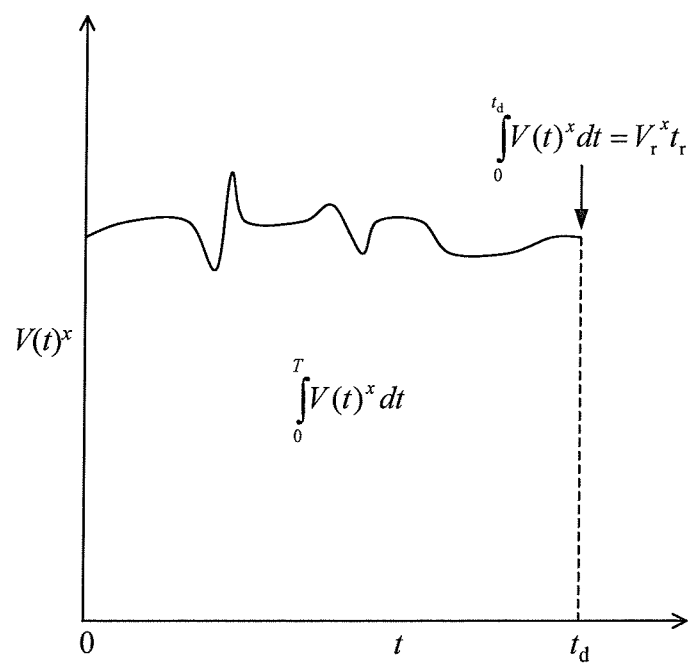
FIG. 3 is a plot of $V(t)^x$ against time for a hypothetical deposition of a layer, according to the first embodiment of FIG. 2.

Thus, when the first parameter is cathode voltage, the deposition time at which the layer has the reference deposition thickness is reached when the condition of Equation (20) is met. This condition is illustrated in FIG. 3 by a plot of $V(t)^x$ against time for a hypothetical deposition of a layer, according to the first embodiment. The program of the controller 102 calculates the integral of Equation (20) by performing a corresponding summation, according to:

$$\sum_0^{t_d} V(t)^x \Delta t = V_r^x t_r, \quad (21)$$

where the deposition time interval $\Delta t$ is limited by the scan speed of the controller 102 and is on the order of 10-40 ms. If this limitation is taken into account, the preferred condition for stopping deposition of the layer becomes:

$$\sum_{0}^{t_d} V(t)^x \Delta t \geq V_r^x t_r. \quad (22)$$

When the controller 102 has a much slower scan speed, Equation (22) may be adjusted by subtracting half the time per scan $t_s$ from the reference deposition time $t_r$, according to:

$$\sum_{0}^{t_d} V(t)^x \Delta t \geq V_r^x \left( t_r - \frac{t_s}{2} \right), \quad (23)$$

for improved statistical performance. Alternatively, the slower scan speed may be taken into account by including a constant offset term in relevant equations, as described heretofore.

As demonstrated by this example, a deposition time at which the layer has a deposition thickness greater than or equal to the reference deposition thickness is determined by calculating an integral over time including the second dependence relationship of the first parameter on time. In some instances, the deposition time is determined by calculating a summation over time including the second dependence relationship of the first parameter on time.

Preferably, the determination of the deposition time includes comparing the second dependence relationship of the first parameter on time to the reference value of the first parameter, and adjusting the deposition time from the reference deposition time accordingly. Most preferably, the deposition time for the layer is determined by calculating an integral over time of the second dependence relationship to a power of the dependence exponent, and comparing the integral to a product of the reference deposition time and the reference value of the first parameter to a power of the dependence exponent. Of course, numerous other equivalent conditions for stopping deposition of the layer may be derived through rearrangement and combination of equations presented heretofore.

Calculation of the integral and comparison of the integral to the product are, preferably, performed by the program of the controller 102. When the value of the integral is greater than or equal to the product, the controller 102 controls the power supply 156 to stop deposition of the layer, in a seventh step 207.

Figure 4:
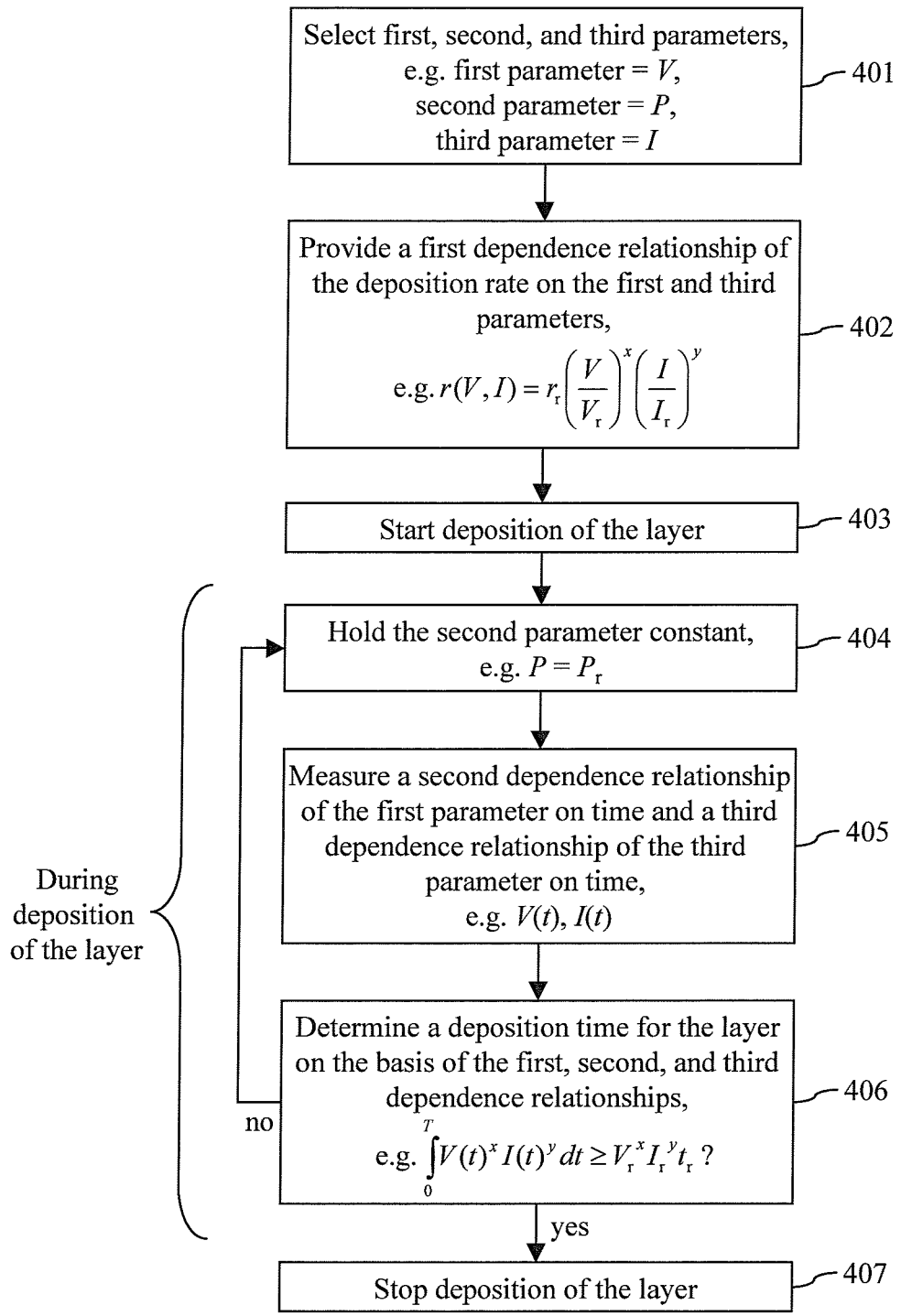
FIG. 4 is a flowchart of a second embodiment of a method for depositing a layer in a sputter-deposition system having a target cathode.

With reference to FIG. 4, a second embodiment of a method for depositing a layer to a reference deposition thickness in a sputter-deposition system 150 having a target cathode 151, as provided by the present invention, is described in brief in the following. Although the second embodiment is described in the context of depositing a single layer, it can also be applied to depositing multiple layers. In a first step 401, first, second, and third parameters are selected from a group of operating parameters consisting of cathode voltage, cathode current, and cathode power, such that the first, second, and third parameters are different operating parameters. In accordance with this selection, the first and third parameters will be allowed to drift over time during deposition of the layer, and the second parameter will be held substantially constant at a reference value. As described heretofore, the selection of the first, second, and third parameters is, preferably, carried out using the interface 101.

The second embodiment is advantageous in instances where the controller 102 is not able to ideally control the power supply 156 to hold the second parameter perfectly constant at the reference value, for example, when the cathode impedance of the plasma changes quickly, when an arc occurs, or when the cathode impedance cannot be matched by the power supply 156. In such instances, considering a first dependence relationship of deposition rate on the first and third parameters is preferable to assuming that the power supply 156 is ideally controlled.

In a second step 402, the first dependence relationship of a deposition rate of the layer on the first and third parameters is provided. For example, when cathode voltage V and cathode current I are selected as the first and third parameters, respectively, the first dependence relationship r(V,I) of the deposition rate on cathode voltage and cathode current is, preferably, expressed as a power function including a reference constant k, a first nonzero dependence exponent x, i.e. $x \neq 0$, and a second nonzero dependence exponent y, i.e. $y \neq 0$, according to:

$$r(V,I) = kV^x I^y. \quad (24)$$

The first and second dependence exponents are each, preferably, greater than or equal to $-3$ and smaller than or equal to 3, i.e. $-3 \leq x \leq 3$ and $-3 \leq y \leq 3$.

As described heretofore, the reference constant and the first and second dependence exponents are, preferably, determined from one or more previous depositions of layers. In some instances, the first dependence relationship is provided by inputting predetermined values of the reference constant and the first and second dependence exponents to the program of the interface 101. In other instances, the reference constant and the first and second dependence exponents are calculated by the program of the interface 101.

Preferably, the reference constant included in the first dependence relationship includes a reference deposition rate and corresponding reference values of the first and third parameters. For example, when the first parameter is cathode voltage and the third parameter is cathode current, the reference constant k is expressed as $$k = \frac{r_r}{V_r^x I_r^y}, \quad (25)$$

where $r_r$ is the reference deposition rate, $V_r$ is a reference value of cathode voltage, and $I_r$ is a reference value of cathode current. By substituting Equation (25) into Equation (24), the first dependence relationship r(V,I) of the deposition rate on cathode voltage and cathode current becomes:

$$r(V, I) = r_r \left( \frac{V}{V_r} \right)^x \left( \frac{I}{I_r} \right)^y. \quad (26)$$

As described heretofore, the reference deposition rate and the reference values of the first and third parameters are, preferably, determined from one or more previous depositions of layers. In some instances, the first dependence relationship is provided by inputting predetermined values of the reference deposition rate, the reference values of the first and third parameters, and the first and second dependence exponents to the program of the interface 101. In other instances, the reference deposition rate, the reference values of the first and third parameters, and the first and second dependence exponents are calculated by the program of the interface 101. Preferably, the reference values of the first, second, and third parameters are updated by the program of the interface 101, as described heretofore.

Once the first, second, and third parameters have been selected and the first dependence relationship of the deposition rate on the first and third parameters has been provided, the program of the interface 101 communicates this information to the controller 102. In a third step 403, deposition of the layer is started. Preferably, the user starts deposition of the layer via the interface 101, which delivers the command to the controller 102. The controller 102 then controls the power supply 156 to start deposition of the layer, as described heretofore.

During deposition of the layer, the controller 102 controls the power supply 156 to hold the second parameter substantially constant at a reference value, in a fourth step 404, and monitors the power supply 156 to measure a second dependence relationship of the first parameter on time and a third dependence relationship of the third parameter on time, in a fifth step 405. On the basis of the first dependence relationship of the deposition rate on the first and third parameters, the second dependence relationship of the first parameter on time, and the third dependence relationship of the third parameter on time, a deposition time for the layer is determined by the program of the controller 102, in a sixth step 406.

As the first and third parameters are allowed to drift over time during deposition of the layer, the deposition rate of the layer also drifts over time. The dependence relationship of the deposition rate on time includes the second dependence relationship of the first parameter on time and the third dependence relationship of the third parameter on time. For example, when the first and third parameters are cathode voltage and cathode current, respectively, the dependence relationship r(t) of the deposition rate on time is derived by including the second dependence relationship V(t) of cathode voltage on time and the third dependence relationship I(t) of cathode current on time in Equation (26), according to:

$$r(t) = r_r \left(\frac{V(t)}{V_r}\right)^x \left(\frac{I(t)}{I_r}\right)^y. \tag{27}$$

Considering Equation (1), the dependence relationship d(T) of the deposition thickness on time is:

$$d(T) = \frac{r_r}{V_r^x I_r^y} \int_0^T V(t)^x I(t)^y dt. \tag{28}$$

To deposit a layer to a reference deposition thickness $d_r$, deposition of the layer must be stopped at a deposition time $t_d$, according to:

$$d_r = \frac{r_r}{V_r^x I_r^y} \int_0^{t_d} V(t)^x I(t)^y dt. \tag{29}$$

Preferably, a condition for stopping deposition of the layer that includes a reference deposition time $t_r$ is derived by substituting Equation (4) into Equation (29) and rearranging to give:

$$\int_0^{t_d} V(t)^x I(t)^y dt = V_r^x I_r^y t_r. \tag{30}$$

As described heretofore, a reference deposition thickness may be provided, preferably, via the program of the interface 101, and the reference deposition time may be calculated from the reference deposition rate and the reference deposition thickness, according to Equation (4), preferably, by the program of the interface 101. Alternatively, a reference deposition time corresponding to the reference values of the first and third parameters may be provided, preferably, via the program of the interface 101.

Thus, when the first parameter is cathode voltage and the third parameter is cathode current, the deposition time at which the layer has the reference deposition thickness is reached when the condition of Equation (29) is met. The program of the controller 102 calculates the integral of Equation (29) by performing a corresponding summation, according to:

$$\sum_0^{t_d} V(t)^x I(t)^y \Delta t = V_r^x I_r^y t_r. \tag{31}$$

As mentioned heretofore, if the limitation of the scan speed of the controller 102 is taken into account, the preferred condition for stopping deposition of the layer becomes:

$$\sum_0^{t_d} V(t)^x I(t)^y \Delta t \geq V_r^x I_r^y t_r. \tag{32}$$

As demonstrated by this example, a deposition time at which the layer has a deposition thickness greater than or equal to the reference deposition thickness is determined by calculating an integral over time including the second dependence relationship of the first parameter on time and the third dependence relationship of the third parameter on time. In some instances, the deposition time is determined by calculating a summation over time including the second dependence relationship of the first parameter on time and the third dependence relationship of the third parameter on time.

Preferably, the determination of the deposition time includes comparing the second dependence relationship of the first parameter on time to the reference value of the first parameter and the third dependence relationship of the third parameter on time to the reference value of the third parameter, and adjusting the deposition time from the reference deposition time accordingly. Most preferably, the deposition time for the layer is determined by calculating an integral over time of the second dependence relationship to a power of the first dependence exponent and the third dependence relationship to a power of the second dependence exponent, and comparing the integral to a product of the reference deposition time, the reference value of the first parameter to a power of the first dependence exponent, and the reference value of the third parameter to a power of the second dependence exponent. Of course, numerous other equivalent conditions for stopping deposition of the layer may be derived through rearrangement and combination of equations presented heretofore.

Calculation of the integral and comparison of the integral to the product are, preferably, performed by the program of the controller 102. When the value of the integral is greater than or equal to the product, the controller 102 controls the power supply 156 to stop deposition of the layer, in a seventh step 407.

Of course numerous other embodiments may be envisaged without departing from the spirit and scope of the invention.

We claim:

1. A method for depositing a layer to a deposition thickness substantially equal to a reference deposition thickness $d_r$ in a sputter-deposition system having a target cathode connected to a power supply, comprising ordered steps of:
   a) providing to a controller a first parameter A, a second parameter B, and a third parameter C, selected from a group of operating parameters of the target cathode consisting of cathode voltage, cathode current, and cathode power, such that the first parameter A, the second parameter B, and the third parameter C are different operating parameters of the target cathode, by means of an interface;
   b) providing to the controller a reference value of the second parameter $B_r$, and a first dependence relationship r(A,C) of a deposition rate r of the layer on the first parameter A and the third parameter C of the form $r(A, C)=kA^xC^y$, wherein k is a reference constant, x is a first dependence exponent, and y is a second dependence exponent, wherein the reference constant k is not equal to 0, and wherein the first dependence exponent x is not equal to 0, by means of the interface;
   c) controlling the power supply to start deposition of the layer, by means of the controller;
   d) controlling the power supply to hold the second parameter B substantially constant at the reference value of the second parameter $B_r$ during deposition of the layer, by means of the controller, while allowing the first parameter A and the third parameter C to drift over time t, so that the deposition rate r is also allowed to drift over time t;
   e) monitoring the power supply to continually measure a second dependence relationship A(t) of the first parameter A on time t during deposition of the layer, by means of the controller;
   f) continually determining whether a deposition time $t_d$ for the layer, at which the layer has a deposition thickness substantially equal to the reference deposition thickness $d_r$, has been reached by performing an integration over time t of the first dependence relationship r(A,C) using the second dependence relationship A(t) as the second dependence relationship A(t) is measured during deposition of the layer, by means of the controller; and
   g) controlling the power supply to stop deposition of the layer once the deposition time $t_d$ has been reached, by means of the controller.

2. The method of claim 1 wherein the reference constant k, the first dependence exponent x, and the second dependence exponent y correspond to values determined from one or more previous depositions of layers carried out while holding the second parameter B substantially constant at the reference value of the second parameter $B_r$.

3. The method of claim 1 wherein the second dependence exponent y is equal to 0; wherein the reference constant k is of the form $$k = \frac{r_r}{A_r^x},$$

wherein $r_r$ is a reference deposition rate, $A_r$ is a corresponding reference value of the first parameter, and x is the first dependence exponent; and wherein the reference deposition rate $r_r$ and the reference value of the first parameter $A_r$ correspond to an average deposition rate $r_a$ and an average value of the first parameter $A_a$, respectively, measured for one or more previous depositions of layers carried out while holding the second parameter B substantially constant at the reference value of the second parameter $B_r$.

4. The method of claim 1 wherein the second dependence exponent y is equal to 0; and wherein the reference constant k is of the form $$k = \frac{r_r}{A_r^x},$$

wherein $r_r$ is a reference deposition rate, $A_r$ is a corresponding reference value of the first parameter, and x is the first dependence exponent; further including a step of determining the reference value of the first parameter $A_r$ and the reference value of the second parameter $B_r$ by updating reference values of the first and second parameters of one or more previous depositions of layers to correct for a difference $\Delta r$ between the reference deposition rate $r_r$ and an average deposition rate $r_a$ measured for the one or more previous depositions of the form $\Delta r = r_r - r_a$, prior to step (b).

5. The method of claim 1 wherein the second dependence exponent y is equal to 0, and wherein step (f) includes continually calculating an integral over time t of the second dependence relationship A(t) to a power of the first dependence exponent x of the form $$\int_0^{t_d} A(t)^x dt.$$

6. The method of claim 5 wherein in step (f) the integral $$\int_0^{t_d} A(t)^x dt$$

is calculated by performing a summation over time t of the second dependence relationship A(t) to a power of the first dependence exponent x of the form $$\sum_0^{t_d} A(t)^x \Delta t.$$

7. The method of claim 1 wherein the second dependence exponent y is equal to 0; wherein the reference constant k is of the form $$k = \frac{r_r}{A_r^x},$$

wherein $r_r$ is a reference deposition rate, $A_r$ is a corresponding reference value of the first parameter, and x is the first dependence exponent; and wherein step (f) includes calculating a reference deposition time $t_r$ for the layer on the basis of the reference deposition rate $r_r$ and the reference deposition thickness $d_r$, continually calculating an integral over time t of the second dependence relationship A(t) to a power of the first dependence exponent x of the form $$\int_0^{t_d} A(t)^x dt,$$

continually comparing the integral $$\int_0^{t_d} A(t)^x dt$$

to a product of the reference deposition time $t_r$ and the reference value of the first parameter $A_r$ to a power of the first dependence exponent x of the form $A_r^x t_r$, and determining that the deposition time $t_d$ has been reached if the integral $$\int_0^{t_d} A(t)^x dt$$

has a value greater than or equal to that of the product $A_r^x t_r$.

8. The method of claim 1 wherein the second dependence exponent y is equal to 0; wherein the reference constant k is of the form $$k = \frac{r_r}{A_r^x},$$

wherein $r_r$ is a reference deposition rate, $A_r$ is a corresponding reference value of the first parameter, and x is the first dependence exponent; and wherein step (f) includes calculating a reference deposition time $t_r$ for the layer on the basis of the reference deposition rate $r_r$, and the reference deposition thickness $d_r$, continually comparing the second dependence relationship A(t) to the reference value of the first parameter $A_r$, and continually adjusting the deposition time $t_d$ from the reference deposition time $t_r$ accordingly.

9. The method of claim 1 wherein the second dependence exponent y is not equal to 0; wherein step (e) further includes monitoring the power supply to continually measure a third dependence relationship C(t) of the third parameter C on time t during deposition of the layer, by means of the controller; and wherein in step (f) the integration over time of the first dependence relationship r(A,C) is performed using the third dependence relationship C(t), as well as the first dependence relationship A(t), as the first dependence relationship A(t) and the third dependence relationship C(t) are measured during deposition of the layer.

10. The method of claim 9 wherein the reference constant k is of the form $$k = \frac{r_r}{A_r^x},$$

wherein $r_r$ is a reference deposition rate, $A_r$ is a corresponding reference value of the first parameter, $C_r$ is a corresponding reference value of the third parameter, x is the first dependence exponent, and y is the second dependence exponent; and wherein the reference deposition rate $r_r$, the reference value of the first parameter $A_r$, and the reference value of the third parameter $C_r$, correspond to an average deposition rate $r_a$, an average value of the first parameter $A_a$, and an average value of the third parameter $C_a$, respectively, measured for one or more previous depositions of layers carried out while holding the second parameter B substantially constant at the reference value of the second parameter $B_r$.

11. The method of claim 9 wherein step (f) includes continually calculating an integral over time t of the second dependence relationship A(t) to a power of the first dependence exponent x and the third dependence relationship C(t) to a power of the second dependence exponent y of the form $$\int_0^{t_d} A(t)^x C(t)^y dt.$$

12. The method of claim 9 wherein the reference constant k is of the form $$k = \frac{r_r}{A_r^x},$$

wherein $r_r$ is a reference deposition rate, $A_r$ is a corresponding reference value of the first parameter, $C_r$ is a corresponding reference value of the third parameter, x is the first dependence exponent, and y is the second dependence exponent; and wherein step (f) includes calculating a reference deposition time $t_r$ for the layer on the basis of the reference deposition rate $r_r$, and the reference deposition thickness $d_r$, continually calculating an integral over time t of the second dependence relationship A(t) to a power of the first dependence exponent x and the third dependence relationship C(t) to a power of the second dependence exponent y of the form $$\int_0^{t_d} A(t)^x C(t)^y dt,$$

continually comparing the integral $$\int_0^{t_d} A(t)^x C(t)^y dt$$

to a product of the reference deposition time $t_r$, the reference value of the first parameter $A_r$, to a power of the first dependence exponent x, and the reference value of the third parameter $C_r$, to a power of the second dependence exponent y of the form $A_r^x C_r^y t_r$, and determining that the deposition time $t_d$ has been reached if the integral $$\int_0^{t_d} A(t)^x C(t)^y dt$$

has a value greater than or equal to that of the product $A_r^x C_r^y t_r$.

* * * * *